(12) United States Patent
Umar (10) Patent No.: US 11,996,867 B2
(45) Date of Patent: May 28, 2024

(54) METHOD, A TRANSMITTER AND A SYSTEM FOR CONTINUOUSLY OPTIMIZING DATA COMPRESSION USING FREQUENCY-BASED DICTIONARY LOOKUP TABLES IN A VEHICLE

(71) Applicant: Continental Automotive GmbH, Hannover (DE)

(72) Inventor: Ahamed Umar, Bangalore (IN)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 17/783,753

(22) PCT Filed: Dec. 16, 2020

(86) PCT No.: PCT/EP2020/086480
§ 371 (c)(1),
(2) Date: Jun. 9, 2022

(87) PCT Pub. No.: WO2021/122785
PCT Pub. Date: Jun. 24, 2021

(65) Prior Publication Data
US 2023/0016080 A1    Jan. 19, 2023

(30) Foreign Application Priority Data
Dec. 18, 2019   (DE) ...................... 10 2019 220 084.2

(51) Int. Cl.
*H03M 7/00*    (2006.01)
*H03M 7/42*    (2006.01)

(52) U.S. Cl.
CPC ..................... *H03M 7/42* (2013.01)

(58) Field of Classification Search
CPC .... H03M 7/42; H03M 7/4056; H03M 7/4062; H04W 4/40
(Continued)

(56) References Cited

U.S. PATENT DOCUMENTS 6,345,307 B1    2/2002    Booth
6,947,483 B2    9/2005    Engwer
(Continued)

FOREIGN PATENT DOCUMENTS

EP    0729237 A2    8/1996

OTHER PUBLICATIONS

Takeshi Kumaki et al. "CAM-based VLSI Architecture for Huffman Coding with Real-time Optimization of the Code Word Table", IEEE International Symposium on Circuits and Systems, IEEE, 2005.
(Continued)

*Primary Examiner* — Jean B Jeanglaude (57) ABSTRACT

Data compression is continuously optimized using frequency-based dictionary lookup tables for communication between a transmitter in a vehicle and a receiver. In a transmitter, first and second frequency-based dictionary lookup tables are provided. The transmitter receives a data block and compresses it using the first table. Using the data block, the second table is updated and a difference between a compression efficiency of the first table and a compression efficiency of the second table for the data block is calculated. The compressed data block is transmitted to the receiver. When the difference is more than a pre-defined threshold, the content of the first table is replaced with the content of the updated second table in the transmitter. The content of the updated second table is then also transmitted to the receiver.

13 Claims, 3 Drawing Sheets

(58) Field of Classification Search
USPC .......................................................... 341/106
See application file for complete search history.

(56) References Cited

U.S. PATENT DOCUMENTS

| | | | |
|---|---|---|---|
| 7,310,055 | B2 | 12/2007 | Odagiri |
| 10,491,240 | B1* | 11/2019 | Dupont ............... G06F 16/9014 |
| 2002/0058501 | A1 | 5/2002 | Hannu et al. |
| 2005/0185677 | A1* | 8/2005 | Christoffersson ....... H04L 69/04 |
| | | | 370/521 |
| 2007/0174209 | A1 | 7/2007 | Fallon et al. |
| 2008/0080718 | A1 | 4/2008 | Meijer et al. |
| 2012/0296983 | A1 | 11/2012 | Boehm |
| 2013/0297575 | A1* | 11/2013 | Fallon ................. H03M 7/4043 |
| | | | 707/693 |
| 2014/0070966 | A1 | 3/2014 | Fablet et al. |
| 2016/0210534 | A1 | 7/2016 | Padubrin |

OTHER PUBLICATIONS

Ievgeniia Maksymova et al. "Review of LiDAR Sensor Data Acquisition and Compression for Automotive Applications", Dec. 6, 2018.
Office Action dated Jul. 15, 2020 from corresponding German patent application No. 10 2019 220 084.2.
International Search Report and Written Opinion dated Apr. 13, 2021 from corresponding International patent application No. PCT/EP2020/086480.

* cited by examiner

# METHOD, A TRANSMITTER AND A SYSTEM FOR CONTINUOUSLY OPTIMIZING DATA COMPRESSION USING FREQUENCY-BASED DICTIONARY LOOKUP TABLES IN A VEHICLE

BACKGROUND

Modern vehicles may transmit data to other vehicles, central servers and/or infrastructure entities along the roads (such as traffic lights) using V2X-communication. Inside vehicles data may be transmitted between sensors and ECUs, Infotainment-systems, etc. The required bandwidth between transmitters and receivers may be huge. The need for more bandwidth to exchange huge amounts of data between systems has resulted in systems capable of handling gigabytes of data in seconds.

Information exchanged between systems can be sent in a symbolic way which could reduce the required bandwidths, that is, information representing the data, but not the data itself, is transmitted. This is the basis of many compression technologies.

However, if the compression and decompression take place on blocks of data, the real-time character of the data transmission may be lost when the blocks of data are too large. When the blocks of data are too small, the compression may be not efficient.

A different approach is to apply probability theory to find the maximum to minimum frequency of occurrence of the data entities and give a symbolic or code word assigned to each of the data entities, such that a data entity which has the maximum frequency of occurrence has the symbolic or code word with least size and a data entity which has the minimum frequency of occurrence has the symbolic or code word with maximum size needed. The relationship between symbolic or code words and the data entities may be found in a dictionary look-up table. This compression technique is used for many lossless data compression algorithms like LZW and Huffman code.

However, the frequency of occurrence of data entities may vary over time, which may cause the dictionary look-up table to be invalid or less efficient.

The object of the invention is to optimize data compression using frequency-based dictionary lookup tables in a vehicle.

BRIEF SUMMARY

The object of the invention is met by a method, a transmitter, and a system according to the independent claims.

In this a method for continuously optimizing data compression using frequency-based dictionary lookup tables for communication between a transmitter in a vehicle and a receiver is provided, comprising the steps of:
- providing in said transmitter a first and a second frequency-based dictionary lookup table;
- receiving a data block in said transmitter;
- compressing said data block in said transmitter using said first table;
- updating a content of said second table using said data block and calculating a difference between a compression efficiency of the first table and a compression efficiency of the second table for said data block;
- transmitting said compressed data block to said receiver; and,
- when said difference is more than a pre-defined threshold, replacing a content of the first table with a content of the updated second table in said transmitter and transmitting said content of the updated second table to said receiver.

The transmitter may be part of a sensor or an electronic control unit (ECU) in a vehicle. The data may be sensor data or/and control data. The receiver may be part of another sensor or another ECU in the same vehicle. The receiver may thus be located inside the same vehicle as the transmitter. In one or more embodiments, the receiver may be located outside of the vehicle in which the transmitter is located.

The communication between the transmitter and the receiver may be based on a wired communication protocol, such as ethernet or CAN, or it may be based on a wireless communication protocol, such as 4G/5G or Wifi or V2X communication.

A vehicle may be a car, motorbike, van or truck. It may also be a bicycle or a scooter.

The wording "continuously optimizing data compression" indicates that while data blocks are continuously being compressed and transmitted, the same data blocks are at the same time used to update the dictionary lookup table in order to make the compression of the next data blocks more efficiently.

Therefore, the step of compressing said data block in said transmitter and/or the step of transmitting said compressed data block to said receiver may be executed simultaneously with the step of updating a content of said second table and/or the step of calculating said difference.

A frequency-based dictionary lookup table is a table that links data entities to code words. In this, a length or a size of a code word for a data entity relates to the frequency of occurrence of the data entity in the data. The table may be based on Huffman coding. Two tables, i.e. a first and a second frequency-based dictionary lookup table, are provided.

The data blocks received may comprise data entities that are listed in the first table and may comprise data entities that are not listed in the first table.

When compressing the data blocks, the data entities that are listed in the first table may be replaced with their corresponding code words. The data entities that are not listed in the first table are not replaced and transmitted in their original form. The compressed data blocks therefore may comprise code words and the data entities that have not been replaced.

The received data blocks are not only compressed but also used to update a second table. Based on the frequency of occurrence of data entities in the received data blocks, the second table is adjusted or updated. This may include adding or removing one or more data entities from the second list and/or changing the corresponding code word for one or more data entities in the second list.

A compression efficiency of a table indicates to what extent the data blocks have been compressed using that table or how much smaller the bit size of the data blocks compressed using that table is with respect to the uncompressed data blocks. The compression efficiency may therefore be defined as the difference in bit size between the compressed data blocks and the uncompressed data blocks divided by the bit size of the uncompressed data blocks.

It may be the case that the compression efficiency of the second table is higher than the compression efficiency of the first table for the received data blocks. In that case, a content of the first table is replaced with a content of the second table. In other words, the first table becomes identical to the second table. With this first table the next received data blocks are going to compressed, while the second table is going to be updated using the next received data blocks. The content of the updated second table is also transmitted to the receiver, since for a decompression in the receiver a copy of the table that is used for the compression is needed.

Since the second table is generated based on the received data it may be expected that indeed the compression efficiency of the second table is higher than the compression efficiency of the first table for the received data blocks. When the content of the first table is replaced by the content of the updated second table, compression of data blocks cannot take place. Replacing the content has therefore a negative effect on the amount of transmitted data per unit time. Furthermore, transmitting said content of the updated second table to the receiver will also require some bandwidth, which has also a negative effect on the amount of transmitted data per unit time.

Therefore, only in case a difference between a compression efficiency of the first table and the second table is more than a pre-defined threshold, the content of the first table is replaced and the content of the updated second table is transmitted to the receiver. This limits the occurrence of the two above-mentioned negative effects.

Replacing the content of the first table with the content of the updated second table may improve the compression efficiency and therefore have a positive effect on the amount of transmitted data per unit time.

The pre-defined threshold may be chosen such that the above-mentioned positive effect will not be cancelled out by the two above-mentioned negative effects.

In one or more embodiments, the method further comprises the steps of:
    providing a copy of said first table in said receiver;
    receiving said compressed data block in said receiver;
    decompressing said received compressed data block in said receiver using said copy;
    receiving said content of the updated second table in said receiver; and,
    replacing a content of said copy with the received content of the updated second table in said receiver.

In one or more embodiments, the data block comprises data entities that are listed in the first table and/or data entities that are not listed in the first table and wherein said compressed data block comprise data entities that are not listed in the first table and/or code words that replace the data entities that are listed in the first table.

In one or more embodiments, said compressing and/or decompressing is based on Huffman Data Compression.

A computer program is provided, wherein the computer program is adapted to perform any of the methods described in this document while the computer program is being executed on a computer.

A computer-readable storage medium storing a set of controller executable code is provided, which, when executed in a device, on a processing system or in a digital signal processor, performs any of the methods described in this document.

A transmitter is provided for continuously optimizing data compression using frequency-based dictionary lookup tables for communication between said transmitter in a vehicle and a receiver, comprising
    a memory unit with a first and a second frequency-based dictionary lookup table; compressor unit for (i) receiving a data block and (ii) compressing said data block in said transmitter using said first table;
    a learning unit for (i) receiving said data block; (ii) updating a content of said second table using said data block; (iii) calculating a difference between a compression efficiency of the first table and a compression efficiency of the second table for said data block; and (iv) replacing a content of the first table with a content of the updated second table when said difference is more than a pre-defined threshold; and,
    an output unit for (i) transmitting said compressed data block to said receiver and (ii) transmitting said content of the updated second table to said receiver, when said difference is more than said pre-defined threshold.

In one or more embodiments of the transmitter, the data block comprises data entities that are listed in the first table and/or data entities that are not listed in the first table and wherein said compressed data block comprises data entities that are not listed in the first table and/or code words that replace the data entities that are listed in the first table.

A system is provided for continuously optimizing data compression using frequency-based dictionary lookup tables for communication between a transmitter in a vehicle and a receiver, comprising
    a transmitter according to any of the embodiments described in this document and a receiver, wherein said receiver comprises:
    a memory unit with a copy of said first frequency-based dictionary lookup table;
    decompressor unit for (i) receiving said compressed data block and (ii) decompressing received compressed data block using said copy;
    an updating unit for (i) receiving said content of the updated second table and (ii) replacing a content of said copy with the received content of the updated second table.

In addition, a vehicle is provided with a transmitter according to any of the embodiments of the transmitter described in this document or with
    a system to any of the embodiments of the system described in this document.

It may be understood that (i) the working of the transmitter, the system and/or the system, (ii) the associated advantages and (iii) further embodiments of the transmitter, the system and/or the vehicle in accordance with the corresponding method steps as described in this document.

BRIEF DESCRIPTION OF THE DRAWINGS

For a more complete understanding of the present invention, reference is established to the following description made in connection with accompanying drawings in which.

DETAILED DESCRIPTION

Figure 1:
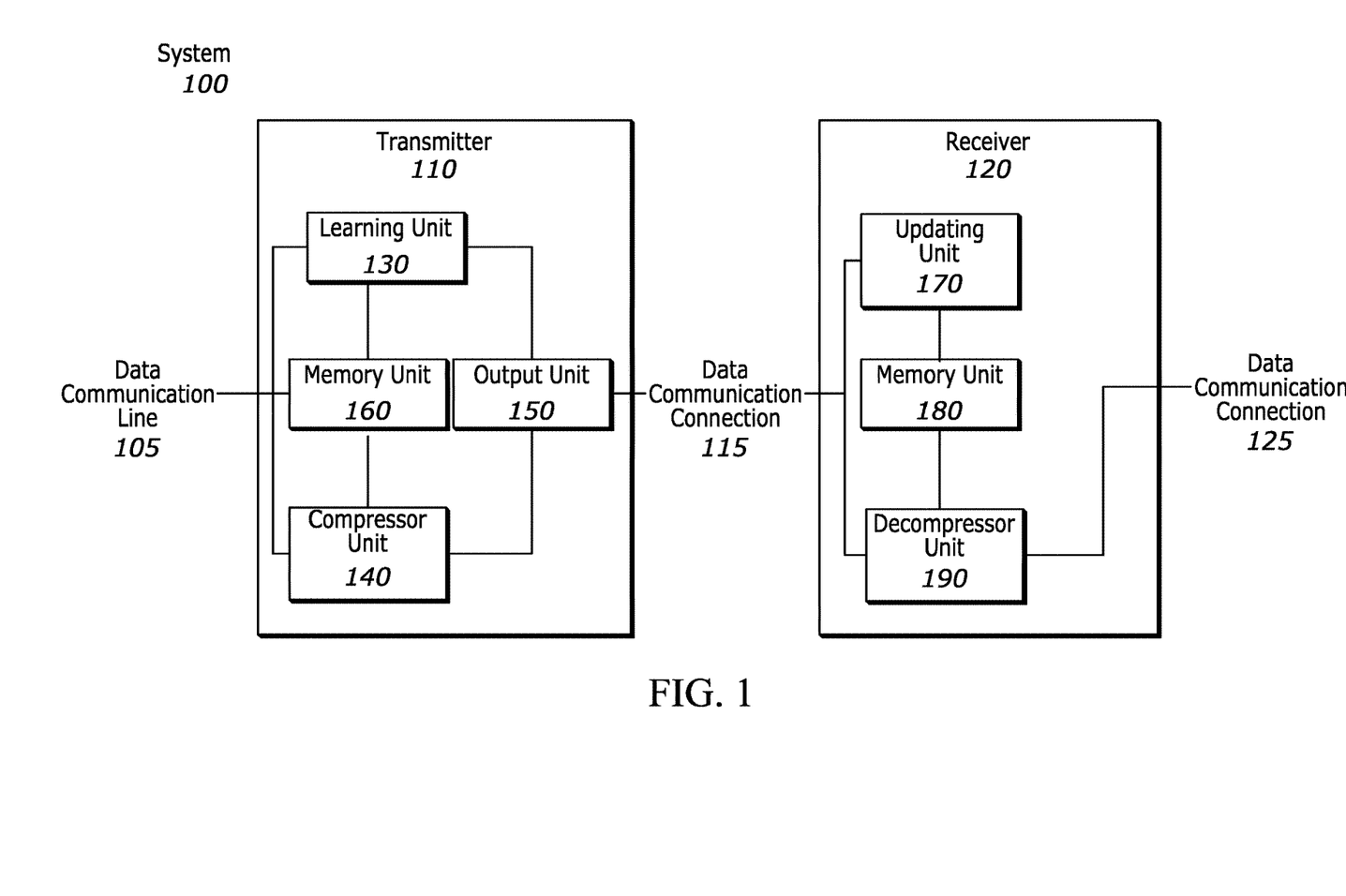
FIG. 1 schematically shows a transmitter, a receiver and a system according to one or more embodiments of the invention.

FIG. 1 schematically shows a transmitter 110, a receiver 120, and a system 100 according to one or more embodiments of the invention. In one or more embodiments, the transmitter 110 may comprise a memory unit 160, a compressor unit 140, a learning unit 130 and/or an output unit 150. In the memory unit 160, a first and a second frequency-based dictionary lookup table may be stored in one or more embodiments. Examples of such tables are discussed below.

The compressor unit 140 may be arranged for receiving data blocks, for example from a data generator using a data communication line 105. The data generator may be a camera or a sensor. The transmitter and the data generator may be combined in one device. The compressor unit 140 is arranged for compressing the received data blocks using the first frequency-based dictionary lookup table.

Although the data may be received in a continuous manner by the receiver, compression and decompression will take place on blocks of data successively. The compression and decompression may take place in real-time, which may indicate that both the data generator and the data user (for example, a CPU that processes the decompressed data) may generate and/or receive the data blocks without any delay caused by the compression and decompression, for example at a rate of 100 Mb/s.

In one or more embodiments, the data block comprises data entities that are listed in the first table and/or data entities that are not listed in the first table. A data entity may be a string of characters of a certain length. For those data entities that are listed in the first table, its frequency of occurrence in previous data blocks may have been established as well as a code word that will replace it upon compression. Those data entities that are not listed in the first table may be new data entities that were not comprised in previous data blocks or for which its frequency of occurrence is so low compared with other data entities that replacement by a code word does not improve the compression efficiency. And therefore, these data entities are not listed in the first table and are not compressed.

Thus, the compressed data block may comprise compressed data entities and uncompressed data entities. The uncompressed data entities may be marked with a unique identification, such that the receiver 120 or the decompressor unit 190 will not try to decompress these.

The learning unit 130 may be arranged for receiving the same data block and use it for updating the second frequency-based dictionary lookup table. The updated second table is optimized for compressing the received data block. The learning unit may compare the compression efficiency of the first and second frequency-based dictionary lookup table and replace the content of the first table (which may be stored in memory unit 160) with a content of the updated second table (which may also be stored in memory unit 160) when said difference is more than a pre-defined threshold. In one or more embodiments, this pre-defined threshold may be a 10% or 25% improvement. In one or more embodiments, the learning unit 130 may be arranged to send the content of the updated second table to output unit 150.

In one or more embodiments, the compression efficiency of the first and second table are determined on the basis of more than one received data block or on the basis of the number of received data blocks in a pre-defined period, for example 1 second.

When the content of a table is replaced, the table cannot be used for compressing. This will have a negative effect on the amount of transmitted data per unit time. Therefore, in one or more embodiments, replacing the content of the first table with the content of the updated second table may take place as follows: a temporal first frequency-based dictionary lookup table may be stored in memory unit 160. The learning unit 130 replaces the content of this temporal first table with the content of the updated second table. Then the learning unit 130 changes (or renames) (i) the temporal first table to the first table and (ii) the first table to the temporal first table. Since replacing the content of table may take more time than changing or renaming it, the time period that the table is unavailable for compressing is reduced.

The output unit 150 may be arranged for transmitting said compressed data block to receiver 120 using a data communication connection 115. This data communication connection may be wired or wireless, it may be based on an Ethernet, a Wifi or a 5G standard. The output unit 150 may also be arranged for transmitting said content of the updated second table to receiver 120, when said compression efficiency difference is more than said pre-defined threshold.

In one or more embodiments, the output unit 150 is further arranged to combine the compressed data blocks and the content of the updated second table. The content of the updated second table may be marked with a unique identification, such that the receiver 120 or the decompression unit 190 will not try to decompress this and the update unit 170 will recognize it as a content of the updated second table.

In one or more embodiments, the receiver 120 may comprise a memory unit 180 with a copy of the first frequency-based dictionary lookup table, a decompressor unit 190 and an updating unit 170. The decompressor unit 190 may be arranged for receiving the compressed data block over data communication connection 115 and for decompressing received compressed data block using the copy of the first table stored on memory unit 180.

The decompressor unit 190 may further be arranged for transmitting the decompressed data block using a data communication connection 125, which may be wired or wireless. The connection 125 may be based on an Ethernet, a Wifi or a 5G standard. The decompressed data block transmitted over connection 125 is identical to the data block received over connection 105.

In one or more embodiments, the updating unit 170 may be arranged for receiving the content of the updated second table, preferably over connection 115, and for replacing the content of the copy of the first table stored on the memory unit 180 with the received content of the updated second table.

In one or more embodiments, replacing the content of the copy with the content of the updated second table may take place as follows: a temporal copy may be stored in memory unit 160. The updating unit 170 replaces the content of this temporal copy with the content of the updated second table. Then the updating unit 170 changes (or renames) (i) the temporal copy to the copy and (ii) the copy to the temporal copy. Since replacing the content of a table may take more time then changing or renaming it, the time period that the copy is unavailable for decompressing is reduced.

In FIG. 1, a system 100 for continuously optimizing data compression using frequency-based dictionary lookup tables for communication between transmitter 110 in a vehicle and receiver 120 according to one or more embodiments is schematically depicted. The receiver 120 may be located inside or outside said vehicle.

Figure 2:
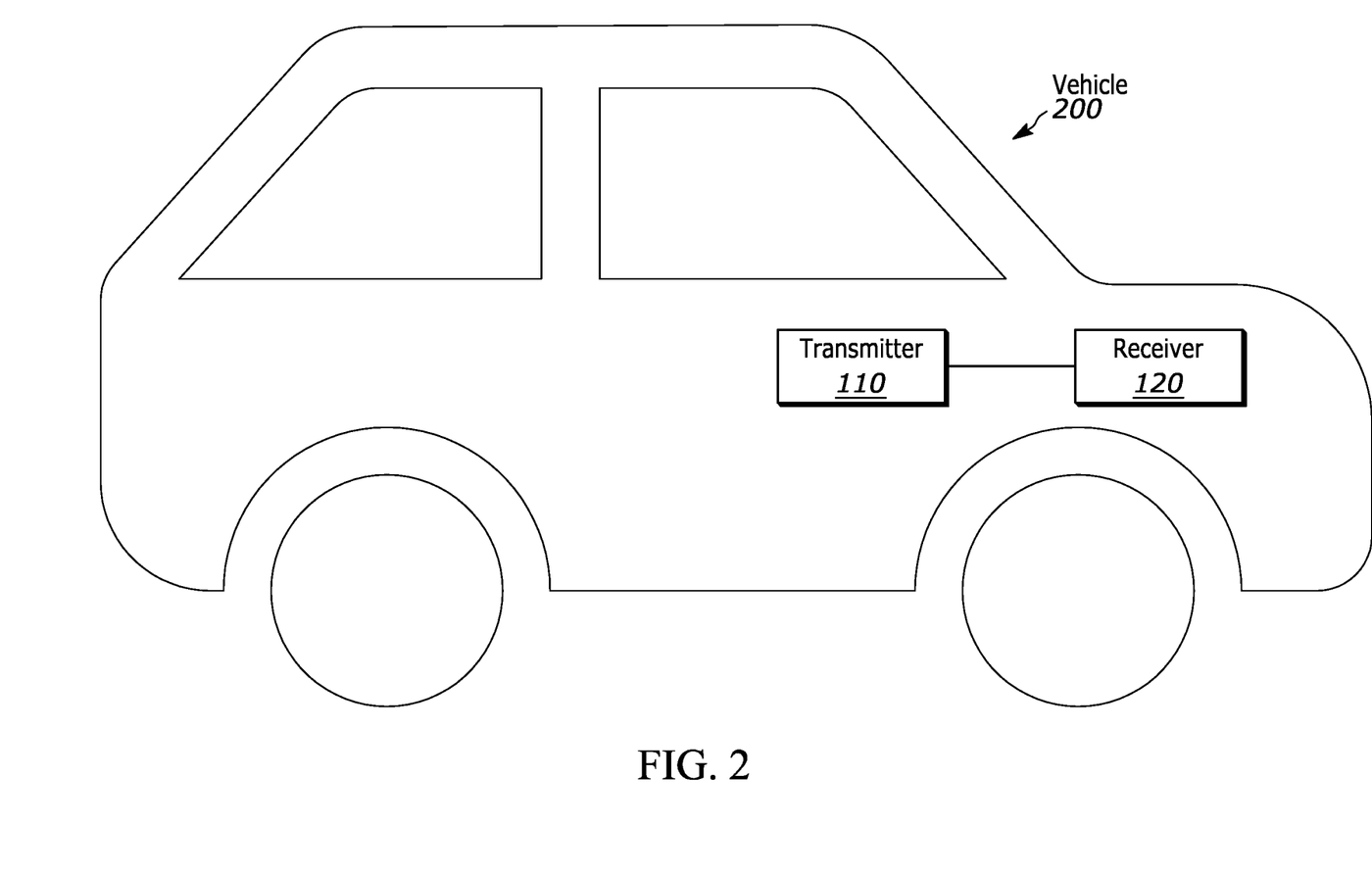
FIG. 2 schematically illustrates a vehicle according to one or more embodiments of the invention; and, FIG. 3 schematically illustrates a method according to one or more embodiments of the invention.

In FIG. 2, a vehicle 200 according to one or more embodiments of the invention is schematically depicted. In one or more embodiments, vehicle 200 may comprise a transmitter 110 according to one or more embodiments as described in this document and/or a receiver 120 according to one or more embodiments as described in this document.

Figure 3:
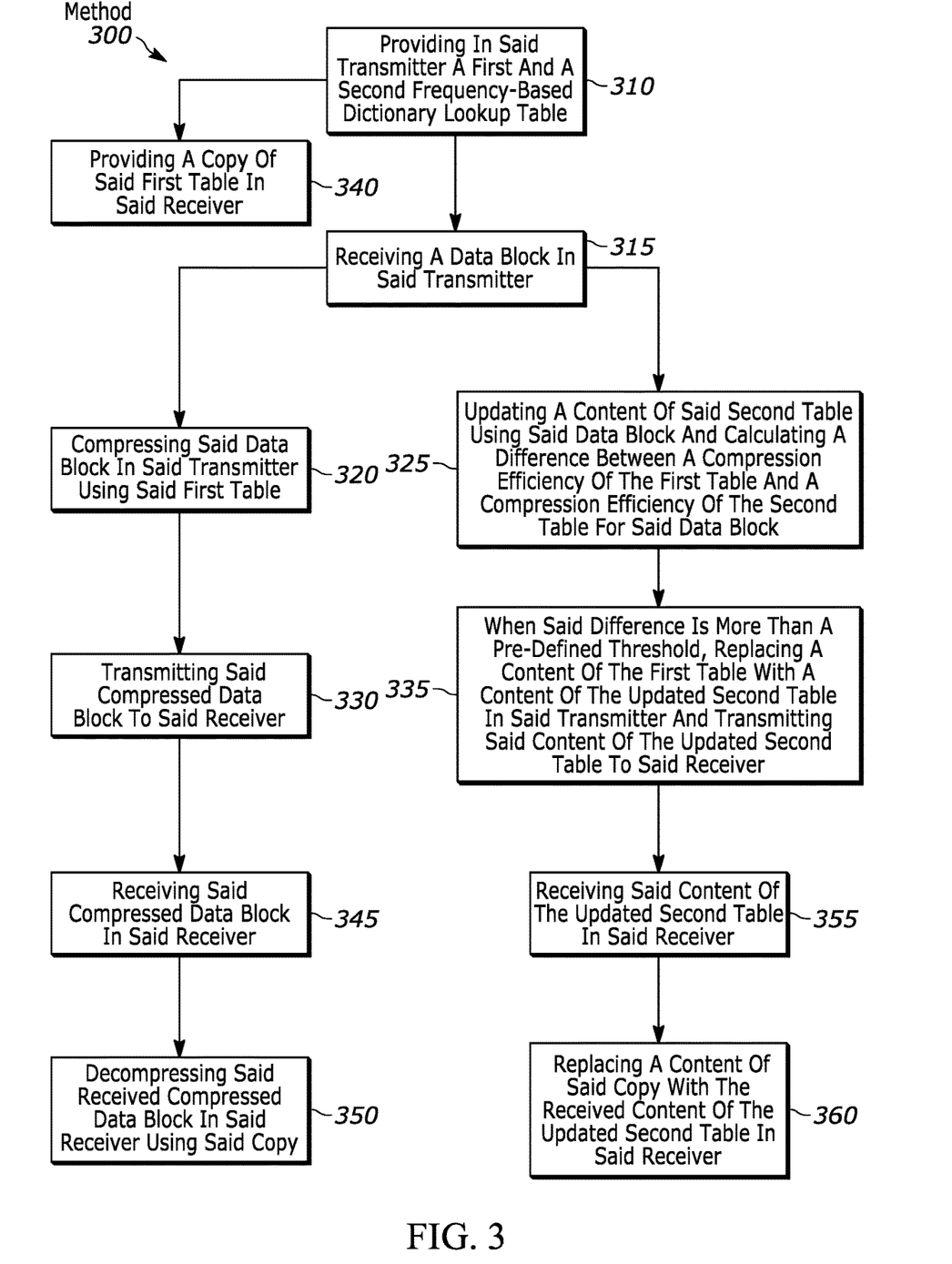

FIG. 3 schematically illustrates a method 300 according to one or more embodiments of the invention. It shows the following steps:

Step 310: providing in said transmitter a first and a second frequency-based dictionary lookup table;

Step 315: receiving a data block in said transmitter;

Step 320: compressing said data block in said transmitter using said first table;

Step 325: updating a content of said second table using said data block and calculating a difference between a compression efficiency of the first table and a compression efficiency of the second table for said data block;

Step 330: transmitting said compressed data block to said receiver; and,

Step 335: when said difference is more than a pre-defined threshold, replacing a content of the first table with a content of the updated second table in said transmitter and transmitting said content of the updated second table to said receiver.

In one or more embodiments, the method 300 may further comprise the following steps:

Step 340: providing a copy of said first table in said receiver;

Step 345: receiving said compressed data block in said receiver;

Step 350: decompressing said received compressed data block in said receiver using said copy;

Step 355: receiving said content of the updated second table in said receiver; and, Step 360: replacing a content of said copy with the received content of the updated second table in said receiver.

In one or more embodiments, the number of different data blocks may be limited, for example when the data blocks refer to repeated steps or to a number between a minimum and maximum for a given system. For example: a CAN Signal carrying Engine RPM Value may have only values between 0 and 8000 RPM in steps of 10 RPM. 2. Or in another example: a 12-bit Analog to Digital Convertor (ADC) with input range of 0 to 10V may only produce digital output from 0 to 4095 in 0.0024 steps.

Since the possible data values in the data block are fixed and these are continuous data, which may obey a normal distribution, an effective data compression is possible.

For example, two data blocks may be considered:

data block 1={3A 3A B1 26 26 F0 F0 26 17 3A AB AB AB AB AB AB AB AB AB 9C 11}*50 times repeated; and, data block 2={3A 3A AB 26 26 F0 F0 26 17 3A B1 B1 B1 B1 B1 B1 B1 B1 B1 9C 11}*50 Times repeated Each data block has 1050 data entities. In this example, the frequency of occurrence of each entity is carefully chosen so that the most occurred entity in data block 1 is "AB" and in data block 2 "B1".

For data block 1, the probability distribution is as follows

| Symbol | Symbol Count | Probability |
|---|---|---|
| B1 | 50 | 0.047619048 |
| 17 | 50 | 0.047619048 |
| 3A | 250 | 0.238095238 |
| 26 | 150 | 0.142857143 |
| AB | 450 | 0.428571429 |
| 9C | 50 | 0.047619048 |
| 11 | 50 | 0.047619048 |

On the basis of the probability distribution the following frequency-based dictionary lookup table may be generated:

| Symbol | Huffman Code |
|---|---|
| B1 | 00001 |
| 17 | 00000 |
| 3A | 01 |
| 26 | 001 |
| AB | 1 |
| 9C | 00011 |
| 11 | 00010 |

This table may be used as the first table for compressing and decompressing data blocks. It may be optimized for data block 1. When it is assumed that data block 2 is a next data block that is received by the transmitter, the learning unit 140 may generate the following the probability distribution for data block 2:

| Symbol | Symbol Count | Probability |
|---|---|---|
| B1 | 450 | 0.428571429 |
| 17 | 50 | 0.047619048 |
| 3A | 250 | 0.238095238 |
| 26 | 150 | 0.142857143 |
| AB | 50 | 0.047619048 |
| 9C | 50 | 0.047619048 |
| 11 | 50 | 0.047619048 |

On the basis of the probability distribution the following frequency-based dictionary lookup table may be generated:

| Symbol | Huffman Code |
|---|---|
| B1 | 1 |
| 17 | 00001 |
| 3A | 01 |
| 26 | 001 |
| AB | 00000 |
| 9C | 00011 |
| 11 | 00010 |

This table may be used as the second table. The learning unit 140 may now calculate a difference between a compression efficiency of the first table and a compression efficiency of the second table for data block 2:

| | first table | second table |
|---|---|---|
| Original Data size | 1150 Bytes | 1150 Bytes |
| Compressed Data size | 500 Bytes | 300 Bytes |
| Compression efficiency | 56.5% | 73.9% |

The calculated difference is 17.4%. When the pre-determined threshold for replacing the content of the first table with the content of the second table is 20%, the content of the first table in the transmitter (and the copy in the receiver) will not be replaced or updated.

Furthermore, one or more embodiments may be described by the following: a method for continuously optimizing data compression using frequency-based dictionary lookup tables for communication between a transmitter in a vehicle and a receiver is provided. The method comprises the following steps. In a transmitter a first and a second frequency-based dictionary lookup table is provided. The transmitter receives a data block and compresses it using the first table. Using the data block the second table is updated and a difference between a compression efficiency of the first table and a compression efficiency of the second table for the data block is calculated. The compressed data block is transmitted to the receiver. When the difference is more than a pre-defined threshold, the content of the first table is replaced with the content of the updated second table in the transmitter. The content of the updated second table is then also transmitted to the receiver.

As will be appreciated by one skilled in the art, aspects of the present invention may be embodied as a system, device, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "unit", "module", "system", "device" or "element".

Functions or steps described in this document may be implemented as an algorithm executed by a microprocessor of a computer. Furthermore, aspects of the present invention may take the form of a computer program product embodied in one or more computer readable medium(s) having computer readable program code embodied, e.g., stored, thereon.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:

1. A method for continuously optimizing data compression using frequency-based dictionary lookup tables for communication between a transmitter in a vehicle and a receiver, comprising:
   providing in said transmitter a first frequency-based dictionary lookup table and a second frequency-based dictionary lookup table;
   receiving a data block in said transmitter;
   compressing said data block in said transmitter using said first frequency-based dictionary lookup table;
   updating a content of said second frequency-based dictionary lookup table using said data block and calculating a difference between a compression efficiency of the first frequency-based dictionary lookup table and a compression efficiency of the second frequency-based dictionary lookup table for said data block;
   transmitting said compressed data block to said receiver; and,
   when said difference is more than a pre-defined threshold, replacing a content of the first frequency-based dictionary lookup table with a content of the updated second frequency-based dictionary lookup, table in said transmitter and transmitting said content of the updated second frequency-based dictionary lookup table to said receiver.

2. The method according to claim 1, further comprising:
   providing a copy of said first frequency-based dictionary lookup table in said receiver;
   receiving said compressed data block in said receiver;
   decompressing said received compressed data block in said receiver using said copy;
   receiving said content of the updated second frequency-based dictionary lookup table in said receiver; and,
   replacing a content of said copy with the received content of the updated second frequency-based dictionary lookup table in said receiver.

3. The method according to claim 2, wherein the data block comprises data entities that are listed in the first frequency-based dictionary lookup table and/or data entities that are not listed in the first frequency-based dictionary lookup table and wherein said compressed data block comprises data entities that are not listed in the first frequency-based dictionary lookup table and/or code words that replace the data entities that are listed in the first frequency-based dictionary lookup table.

4. The method according to claim 3, wherein said compressing and/or decompressing is based on Huffman Data Compression.

5. A non-transitory computer-readable storage medium storing a set of controller executable code, which, when executed in a device, on a processing system, or in a digital signal processor, continuously optimizes data compression using frequency-based dictionary lookup tables for communication between a transmitter in a vehicle and a receiver, by performing operations comprising:
   providing in said transmitter a first frequency-based dictionary lookup table and a second frequency-based dictionary lookup table;
   receiving a data block in said transmitter;
   compressing said data block in said transmitter using said first frequency-based dictionary lookup table;
   updating a content of said second frequency-based dictionary lookup table using said data block and calculating a difference between a compression efficiency of the first frequency-based dictionary lookup table and a compression efficiency of the second frequency-based dictionary lookup table for said data block;
   transmitting said compressed data block to said receiver; and,
   when said difference is more than a pre-defined threshold, replacing a content of the first frequency-based dictionary lookup table with a content of the updated second frequency-based dictionary lookup table in said transmitter and transmitting said content of the updated second frequency-based dictionary lookup table to said receiver.

6. The non-transitory computer-readable storage medium according to claim 5, having stored thereon additional controller executable code for performing further operations comprising:
   providing a copy of said first frequency-based dictionary lookup table in said receiver;
   receiving said compressed data block in said receiver;
   decompressing said received compressed data block in said receiver using said copy;
   receiving said content of the updated second frequency-based dictionary lookup table in said receiver; and,
   replacing a content of said copy with the received content of the updated second frequency-based dictionary lookup table in said receiver.

7. The non-transitory computer-readable storage medium according to claim 6, wherein the data block comprises data entities that are listed in the first frequency-based dictionary lookup table and/or data entities that are not listed in the first frequency-based dictionary lookup table and wherein said compressed data block comprises data entities that are not listed in the first frequency-based dictionary lookup table and/or code words that replace the data entities that are listed in the first frequency-based dictionary lookup table.

8. The non-transitory computer-readable storage medium according to claim 7, wherein said compressing and/or decompressing is based on Huffman Data Compression.

9. A system for continuously optimizing data compression using frequency-based dictionary lookup tables for communication between a transmitter in a vehicle and a receiver, comprising:
- a transmitter, comprising
  - a memory unit with a first frequency-based dictionary lookup table and a second frequency-based dictionary lookup table;
  - compressor unit for (i) receiving a data block and (ii) compressing said data block in said transmitter using said first frequency-based dictionary lookup table;
  - a learning unit for (i) receiving said data block; (ii) updating a content of said second frequency-based dictionary lookup table using said data block; (iii) calculating a difference between a compression efficiency of the first frequency-based dictionary lookup table and a compression efficiency of the second frequency-based dictionary lookup table for said data block; and (iv) replacing a content of the first frequency-based dictionary lookup table with a content of the updated second frequency-based dictionary lookup table when said difference is more than a pre-defined threshold;
  - an output unit for (i) transmitting said compressed data block to said receiver and (ii) transmitting said content of the updated second frequency-based dictionary lookup table to said receiver, when said difference is more than said pre-defined threshold; and
  - wherein said data block comprises data entities that are listed in the first frequency-based dictionary lookup table and/or data entities that are not listed in the first frequency-based dictionary lookup table and wherein said compressed data block comprises data entities that are not listed in the first frequency-based dictionary lookup table and/or code words that replace the data entities that are listed in the first frequency-based dictionary lookup table; and
- a receiver, wherein said receiver comprises:
  - a memory unit with a copy of said first frequency-based dictionary lookup table;
  - decompressor unit for (i) receiving said compressed data block and (ii) decompressing received compressed data block using said copy;
  - an updating unit for (i) receiving said content of the updated second frequency based dictionary lookup table and (ii) replacing a content of said copy with the received content of the updated second frequency-based dictionary lookup table.

10. A transmitter for continuously optimizing data compression using frequency-based dictionary lookup tables for communication between said transmitter in a vehicle and a receiver, comprising
- a memory unit with a first frequency-based dictionary lookup table and a second frequency-based dictionary lookup table;
- compressor unit for (i) receiving a data block and (ii) compressing said data block in said transmitter using said first frequency-based dictionary lookup table;
- a learning unit for (i) receiving said data block; (ii) updating a content of said second frequency-based dictionary lookup table using said data block; (iii) calculating a difference between a compression efficiency of the first frequency-based dictionary lookup table and a compression efficiency of the second frequency-based dictionary lookup table for said data block; and (iv) replacing a content of the first frequency-based dictionary lookup table with a content of the updated second frequency-based dictionary lookup table when said difference is more than a pre-defined threshold; and,
- an output unit for (i) transmitting said compressed data block to said receiver and (ii) transmitting said content of the updated second frequency-based dictionary lookup table to said receiver, when said difference is more than said pre-defined threshold.

11. The transmitter according to claim 10, wherein said data block comprises data entities that are listed in the first frequency-based dictionary lookup table and/or data entities that are not listed in the first frequency-based dictionary lookup table and wherein said compressed data block comprises data entities that are not listed in the first frequency-based dictionary lookup table and/or code words that replace the data entities that are listed in the first frequency-based dictionary lookup table.

12. A vehicle with a transmitter for continuously optimizing data compression using frequency-based dictionary lookup tables for communication between said transmitter in a vehicle and a receiver, the transmitter comprising:
- a memory unit with a first frequency-based dictionary lookup table and a second frequency-based dictionary lookup table;
- compressor unit for (i) receiving a data block and (ii) compressing said data block in said transmitter using said first frequency-based dictionary lookup table;
- a learning unit for (i) receiving said data block; (ii) updating a content of said second frequency-based dictionary lookup table using said data block; (iii) calculating a difference between a compression efficiency of the first frequency-based dictionary lookup table and a compression efficiency of the second frequency-based dictionary lookup table for said data block; and (iv) replacing a content of the first frequency-based dictionary lookup table with a content of the updated second frequency-based dictionary lookup table when said difference is more than a pre-defined threshold; and,
- an output unit for (i) transmitting said compressed data block to said receiver and (ii) transmitting said content of the updated second frequency-based dictionary lookup table to said receiver, when said difference is more than said pre-defined threshold.

13. The vehicle of claim 12, wherein said data block comprises data entities that are listed in the first frequency-based dictionary lookup table and/or data entities that are not listed in the first frequency-based dictionary lookup table and wherein said compressed data block comprises data entities that are not listed in the first frequency-based dictionary lookup table and/or code words that replace the data entities that are listed in the first frequency-based dictionary lookup table.

* * * * *